United States Patent [19]

Roessler

[11] Patent Number: 4,853,698

[45] Date of Patent: Aug. 1, 1989

[54] PROCESS FOR THE DIGITAL TO ANALOG CONVERSION OF DIGITAL INFORMATION IN BIPOLAR ANALOG SIGNALS

[75] Inventor: Bernward Roessler, Munich, Fed. Rep. of Germany

[73] Assignee: Siemens Aktiengesellschaft, Berlin and Munich, Fed. Rep. of Germany

[21] Appl. No.: 906,367

[22] Filed: Sep. 12, 1986

[30] Foreign Application Priority Data

Sep. 23, 1985 [DE] Fed. Rep. of Germany ....... 3533874

[51] Int. Cl.⁴ .............................................. H03M 1/78
[52] U.S. Cl. .................................... 341/150; 341/144; 341/154
[58] Field of Search .... 340/347 C, 347 AD, 347 DB, 340/347 M; 341/127, 131, 144, 145, 150, 154; 307/246; 324/78 E

[56] References Cited

U.S. PATENT DOCUMENTS 4,380,756  4/1983  Worsman ..................... 340/347 C X
4,667,179  5/1987  Law et al. ................ 340/347 AD X

OTHER PUBLICATIONS

McCreary et al, All-MOS Charge Redistribution Analog-to-Digital . . . , IEEE Journal of Solid-State Circuits, vol. SC-10, No. 6, 12/1975, pp. 371–379.
The Engineering Staff of Analog Devices, Inc., Analog-Digital Conversion Handbook, 6/1972, pp. II-16 to II-27; II-46 to II-48.
Timbie et al, Principles of Electrical Engineering, John Wiley & Sons, Inc., 1922, pp. 309–311.

*Primary Examiner*—William M. Shoop, Jr.
*Assistant Examiner*—Brian Young
*Attorney, Agent, or Firm*—Adel A. Ahmed

[57] ABSTRACT

In a process of digital to analog conversion, use is made of a network comprising capacitors (C through C'/16) which are binary-stepped in their capacitance, and whose lower terminals, depending upon the binary value of the allocated bit of a digital signal to be converted, are switchable to a reference voltage source ($V_{ref}$) or to ground potential and thus either codetermine or do not codetermine the value of the network output voltage representing the analog signal. In order to achieve a monotonic and possibly linear converter characteristic when converting into bipolar signals, the network is so switched that, when generating positive and negative analog values of the same order, it always involves the same capacitors, and no additional capacitor is required for change redistribution.

3 Claims, 2 Drawing Sheets

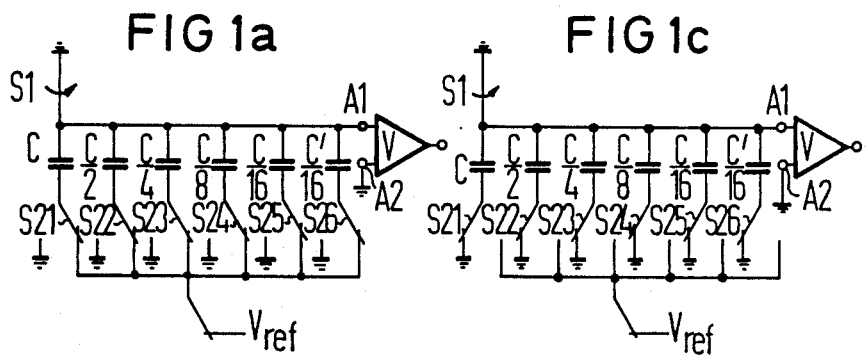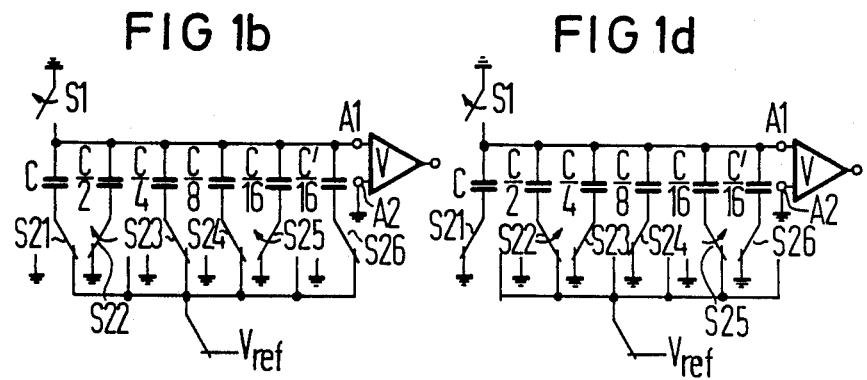

PROCESS FOR THE DIGITAL TO ANALOG CONVERSION OF DIGITAL INFORMATION IN BIPOLAR ANALOG SIGNALS

BACKGROUND OF THE INVENTION

This invention relates to a process for the digital to analog conversion of digital information in bipolar analog signals by means of a network comprising capacitors which are binary-stepped in their capacitance, and whose lower terminals referring to the drawing, depending upon the binary value of the digital information bit to which said lower terminals are allocated, are switched to ground potential or to a reference voltage source and thus either codetermine or do not codetermine the value of the network output voltage representing the analog signal after a charge has been redistributed.

When digital to analog converters (D/A converters) are used as a constituent part of interactive analog to digital converters (A/D converters) which must have a high resolution, the converter characteristic will require a high degree of linearity.

The same applies when D/A converters are a constituent part of an echo compensator which, in conjunction with the data transmission between subscriber station and telephone exchange of a communications system, is used via a two-wire circuit during full duplex operation. That is to say, the quality of echo cancellation depends to a large extent upon the non-linearities of the converter characteristic.

With a known D/A converter of the abovementioned type, which operates with a network of binary-weighted capacitors and is a constituent part of an A/D converter (High Speed CMOS A/D Conversion Techniques Techniques by William C. Black, pp. 44–53, 248–249, Memorandum No. Ucb/Erl MBO/54, November 1980), bipolar signals can be generated by means of a positive and a negative reference voltage (refer to FIG. 3.17 of the above Memorandum). When said reference voltages are not exactly equal, non-linearities are produced of an even-numbered order, the prevention of which requires alignment.

With another D/A converter of the kind referred to in the above Memorandum, by means of which bipolar signals are generated, only a signal reference voltage is required, while, on the other hand, the capacitor network has a capacitor with a peak-value capacitance which, when generating analog signals of one polarity, displaces the converter characteristic (refer to FIG. 3.19 of the above Memorandum) so that varying converter signals are required for the generation of positive and negative signals so that a non-linearity of an even-numbered order likewise exists.

Another known D/A converter for bipolar signals is used as a constituent part of an echo compensator and, likewise uses only one reference voltage, but, on the other hand, has an additional capacitor producing the aforementioned effects on the linearity of the converter. Steps can be taken for this D/A converter to reduce the influence of non-linearities on the results of echo cancellation in that, during the conversion process, one of the capacitors of the capacitor network, notwithstanding the process involving the remaining capacitors, is not connected directly to the reference voltage. The said reference voltage is fed instead to said capacitor via a voltage divider provided with non-linear tappings (Large Scale Integration of Hybrid Method Digital Subscriber Loops by Oscar Ernesto Agazzi, pp. 161–171, Memorandum No. Ucb/Erl M82/41, May 20, 1982). Since the tolerances of said additional capacitor, which essentially cause the non-linearities of the converter, are predominantly unsystematic, the elimination of the influence of said tolerances on echo cancellation by said means can be achieved only at disproportionate cost.

SUMMARY OF THE INVENTION

It is the object of the present invention to provide a D/A conversion process for the generation of bipolar signals, which operates in accordance with a monotonic and possibly linear converter characteristic, without requiring alignment.

This problem is solved by means of the initially mentioned process wherein, according to the invention, the redistribution of the charge for generating positive and negative analog signal values of the same order always involves the same capacitors.

According to a further development of the present invention, one embodiment of the process according to the invention is characterized by the fact that, in a preparatory sequence, an upper plate of all the capacitors of the network which together form one upper connected terminal point is applied to ground potential and, depending upon whether the value of the sign bit of the digital information to be converted requires the generation of a positive or negative analog value, the other plate and thus a lower connected terminal of each of the capacitors is switched to the reference voltage source or, likewise, to ground potential; and in a subsequent step, during which the charge is redistributed, the upper terminals of all capacitors are switched off from ground potential and those lower terminals of the capacitors, allocated to bits having the binary value of 1, are switched to ground potential or to the reference voltage source, whereas the lower terminals of the remaining capacitors are switched oppositely to the reference voltage source or to ground potential.

A D/A converter operating by said method is particularly well suited to be an integral part of an A/D converter operating in accordance with iterative process.

According to a further development of the present invention, an embodiment of the process according to the invention is characterized by the fact that in a preparatory sequence, depending upon whether the value of the sign bit of the digital information to be converted requires the generation of a positive or negative analog value, the lower switch terminals of the capacitor which is allocated to the sign bit, and of those capacitors allocated to the bits having the binary value of 0, are switched to ground potential or to the reference voltage source, and the lower switch terminals of the remaining capacitors allocated to the bits having the binary value of 1 are switched to the reference voltage source or ground potential; and, in a subsequent step during which the charge is redistributed, the capacitors allocated to the bits having a binary value of 1 are similarly switched oppositely to ground potential or to a reference voltage source.

This embodiment according to the invention is particularly advantageous when the D/A converter is part of an analog portion of an echo compensator in which occurs, for the purpose of correcting the setting of the transversal filter of the echo compensator, a D/A conversion of a compensation siganal, the actual compensation, as well as an A/D conversion of the remaining echo signal.

In any event, the D/A converter with a capacitance network which is used for this operation requires only a reference voltage source. Additional capacitance which might be the cause of non-linearity, as described in prior art solutions, is thus avoided.

The following is a detailed description by means of two exemplary embodiments, with references to two drawings.

BRIEF DESCRIPTION OF THE DRAWING

FIGS. 1a through 1d show a network comprising capacitors which are binary-stepped in their capacitance, whereby the process according to the invention is executed in four different operating states as specified in a first process variant.

DETAILED DESCRIPTION

Figure 2A:
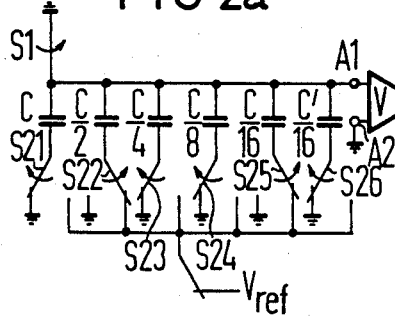
In FIGS. 2a through 2d said network is shown in four different operating states in accordance with a second process variant.

A capacitor network, as used in the process according to the invention, consists, as is shown by way of an example in FIG. 1a, of a plurality of capacitors which are binary-stepped in their capacitance, and thus have the capacitance values C, C/2, C/4, etc., C/16 and, respectively in accordance with their capacitances are allocated to a higher or lower-order bit of a digital signal to be subjected to a D/A conversion. In addition, there is a further capacitor having the lowest capacitance value C/16, which is designated as C'/16.

One group of the plates of the capacitors, shown in the Figure as forming a single upper connected terminal of the network, can be switched via a two position switch S1 to ground potential. The other plates of said capacitors, comprising separate switchable terminals of the network, can be applied via respective separate two position switches S21 through S26 to a circuit point carrying ground potential or to a reference voltage source supplying the reference voltage $V_{ref}$.

Between the output terminal A1, which is connected to the interconnected upper plates of the capacitors, and a terminal A2 applied to ground potential, an output voltage forming the input voltage of an operation amplifier V can be obtained with this network.

FIG. 1a shows the operating state of the capacitor network following a preparatory sequence for the generation of a negative analog value corresponding to the binary value of the sign bit of the digital information to be converted. Consequently, the interconnected upper plates of the capacitors, which form the top end of said network, are switched to ground potential via the switch S1, and the bottom ends of the capacitor are switched to the reference voltage $V_{ref}$ via the switches S21 through S26. The capacitors, which are parallel connected in the present method, are thus charged with the charge $Q_x = -2C \times V_{ref}$ since the sum of the capacitance values of all capacitors results in the capacitance value of 2C. In the following sequences, which serve to redistribute the charge, activation of the switch S1 causes the interconnected upper terminals of the capacitors to be switched off from ground potential; and the lower terminals of those capacitors, which are allocated to the bits having the binary value of 1 whose digital information is to be converted, are switched to ground potential by activating the corresponding switch. In the example given, see FIG. 1b, these are: the capacitor having the capacitance C/2, to which is allocated the highest bit after the sign bit, as well as the capacitor having the capacitance C/16, to which is allocated the lowest-order bit of the digital information. The second capacitor C'/16 having the capacity C/16, as well as all of the remaining capacitors, remain with their lower terminals connected to the reference voltage $V_{ref}$. The output voltage of the capacitor network between the output terminals A1 and A2, which thus far had the value Vx=0, then changes to the value $$V_x = -\frac{C/2 + C/16}{2C} V_{ref}.$$

This output voltage represents the analog value of the accepted digital information.

In the event that a positive analog value is to be expected from the sign bit of the digital information to be converted, then the preparatory sequence, as shown in FIG. 1c, will be such that, when the switches S1 and S21 through S26 are activated, both the upper interconnected and lower terminals of the capacitors of the network are all switched to ground potential.

In the subsequent sequence, the top ends of the capacitors will be switched off from ground potential by the activation of switch S1, and again—provided that the second highest-order and lowest-order bit of the digital information to be converted has the binary value of 1—the lower terminal of the capacitor having the capacitance C/2, and of the capacitors having the capacitance C/16, respectively are switched to the reference voltage $V_{ref}$ by the activation of switches S22 and S25, whereas the lower terminals of all the remaining capacitors remain switched to ground potential. The output voltage between the output terminal A1 and A2 thus changes from the value of Vx=0 to $$V_x = \frac{C/2 + C/16}{2C} V_{ref}.$$

From the above explanation it is clear that with the conversion process according to the invention the switchable capacitors of the capacitor network respectively form similar groups in order to represent a positive or negative analog value; the converter characteristic therefore is symmetric to the zero point, and non-linearities of the first order are thus prevented.

A second embodiment of the process according to the invention is now described in detail by means of FIGS. 2a through 2d. These figures again show a similarly structured capacitor network comprised of capacitors which are binary-stepped in their capacitance, said network being structured like the one shown in FIGS. 1a through 1d but operated by a different method, as described below.

If on account of a sign bit, the emission of a negative analog signal value can be expected, then, as is shown in FIG. 2a, in a preparatory sequence, the interconnected upper terminals of the capacitors will be switched to ground potential, due to the activation of the switch S1. The several lower terminals of the capacitors, insofar as they are allocated to the bits of digital information which have the binary value of 0—which in this example are the lower terminals of the capacitors C/4 and C/8—will be applied to ground potential. The same applies to the lower terminals of the capacitor C allocated to the sign bit and of the capacitor C'/16. The lower terminals of all the remaining capacitors, i.e., those allocated to the bits which have the binary value of 1, in this case the capacitors C/2 and C/16, are switched via the corresponding switches S22 and S25 to the reference voltage $V_{ref}$.

Figure 2C:
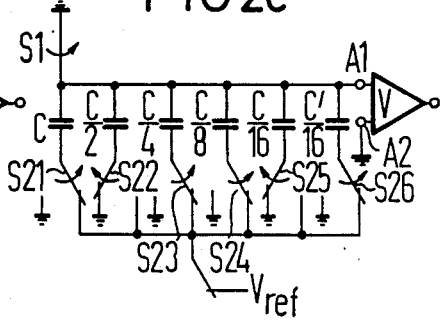
Figure 2B:
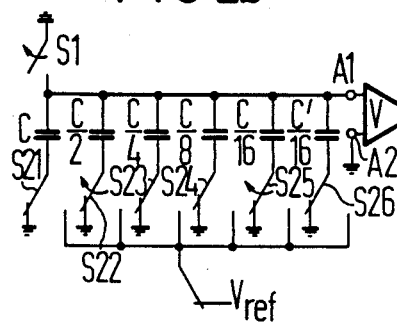
Figure 2D:
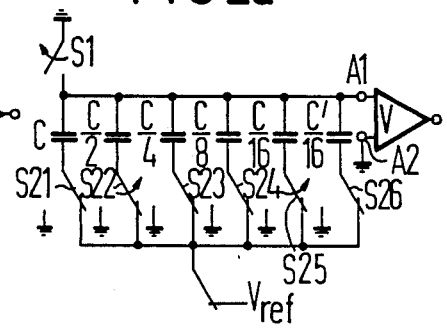

In a subsequent sequence which serves to redistribute the charge, the lower terminals of the capacitors C/2 and C'/16 are switched off from the reference voltage and applied to ground potential, see FIG. 2b. Between the output terminals A1 and A2, the output voltage then changes from Vx=0 to $$Vx = \frac{C/2 + C/16}{2C} V_{ref}.$$

If on account of the sign bit, positive analog signal values are expected, the preparation for this second variant of the process according to the invention consists—as FIG. 2c shows—in the fact that the interconnected upper terminals of the capacitors are, again, switched to ground potential via the switch S1, but that, deviating from the previously described process, the lower terminals of the capacitors allocated to the sign bit, that is, those capacitors allocated to the bits having the binary value of 0—which in this case are the capacitors C/4 and C/8, as well as the capacitor C'/16 which is operated independent of the binary value of the lowest-order bit—are switched to the reference voltage $V_{ref}$' whereas the capacitors allocated to the bits with the binary value of 1, which in this case are the capacitors C/2 and C/16, are switched to ground potential.

During the second sequence, when the charge is redistributed, the lower terminals of said capacitors C/2 and C/16 are likewise connected to the reference voltage source, so that between output terminals A1 and A2 is applied the output voltage $$Vx = \frac{C/2 + C/16}{2C} V_{ref}$$

which represents the analog signal value of the data signal which is to be converted.

Thus there have been described and shown variant methods in accordance with the present invention involving a similar network for switchable capacitors for digital to analog conversion which is only limited in scope by the claims which follow.

What is claimed is:

1. A process for the digital to analog conversion of digital information in bipolar analog signals by means of a network comprising capacitors which are binary-stepped in their capacitance and a further capacitor having the same capacitance as the lowest value capacitor, whereof the lower terminals, depending on the binary value of the digital information bit to which said lower terminals are respectively allocated, are coupled to ground potential or to a reference voltage source providing voltage of one polarity only and thereby codetermine or do not codetermine the value of the network output voltage representing the analog signal after a charge has been redistributed, wherein the same capacitors always take part in the charge redistribution for generating positive and negative analog values of the same amount.

2. A process in accordance with claim 1 further characterized in that, in a preparatory sequence, upper interconnected plates of the capacitors of the network, are switched to ground potential, and, depending upon whether the value of the sign bit of the digital information to be converted requires the generation of a positive or negative analog value, the other plates representing the separate, lower terminals of the capacitors are applied to the reference voltage source or ground potential, and in a subsequent step, during which the charge is redistributed, the upper interconnected plates of all capacitors are switched off from ground potential and the separate lower terminals of the capacitors allocated to the bits having the binary value of 1 are switched to ground potential or to the reference voltage source, whereas the plates which represent the lower terminals of the remaining capacitors remain switched to the reference voltage source or to ground potential.

3. A process in accordance with claim 1 further characterized in that, in a preparatory sequence, upper interconnected plates of the capacitors (C through C/16), are switched to ground potential, and, depending upon whether the value of the sign bit of the digital information to be converted requires a positive or a negative analog value, the lower plates of the capacitor (C), allocated to the sign bit, and the plates of those capacitors (e.g., C/4, C/8) allocated to the bits having the binary value of 0, as well as the plates of a further capacitor (C'/16), said capacitor having the same capacitance as the capacitor (C/16) allocated to the lowest-order bit of the digital information to be converted, are switched to ground potential or to the reference voltage source ($V_{ref}$), and the lower plates of the capacitors (e.g., C/2, C/16), which are allocated to the bits having the binary value of 1, are oppositely switched to the reference voltage source or to ground potential, and in a subsequent step, which serves to redistribute the charge, the interconnected upper plates of the capacitors (C through C'/16) are switched off from ground potential, and the lower plates of the capacitors (for example, C/2, C/16), allocated to the bits having the binary value of 1, are switched similarly to the others to ground potential or to the reference voltage source ($V_{ref}$).

* * * * *